United States Patent
Takahashi et al.

(10) Patent No.: US 7,473,945 B2
(45) Date of Patent: Jan. 6, 2009

(54) OPTICAL SEMICONDUCTOR INTEGRATED CIRCUIT DEVICE

(75) Inventors: Tsuyoshi Takahashi, Gunma (JP); Katsuya Okabe, Gunma (JP); Akira Hatsugai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 61 days.

(21) Appl. No.: 11/086,989

(22) Filed: Mar. 23, 2005

(65) Prior Publication Data
US 2005/0218417 A1    Oct. 6, 2005

(30) Foreign Application Priority Data
Mar. 30, 2004    (JP)    .............. 2004-097548

(51) Int. Cl.
*H01L 27/148*    (2006.01)
(52) U.S. Cl. ...................... 257/233; 257/292
(58) Field of Classification Search ................. 257/233, 257/292
See application file for complete search history.

(56) References Cited
U.S. PATENT DOCUMENTS

| | | | | |
|---|---|---|---|---|
| 5,576,239 | A * | 11/1996 | Hatano et al. | ............... 438/69 |
| 5,736,756 | A * | 4/1998 | Wakayama et al. | ......... 257/223 |
| 6,452,243 | B1 * | 9/2002 | Hatano et al. | ............... 257/448 |
| 6,635,911 | B2 | 10/2003 | Maruyama | |
| 6,784,015 | B2 * | 8/2004 | Hatano et al. | ................. 438/75 |
| 2002/0003230 | A1 * | 1/2002 | Maruyama | .................... 257/53 |
| 2003/0168658 | A1 | 9/2003 | Fukushima et al. | |
| 2005/0106767 | A1 * | 5/2005 | Takahashi et al. | ............. 438/29 |

FOREIGN PATENT DOCUMENTS

| | | |
|---|---|---|
| CN | 1447441 A | 10/2003 |
| JP | 10-107242 | 4/1998 |
| JP | 2001-189443 A | 7/2001 |

* cited by examiner

*Primary Examiner*—Long Pham
(74) *Attorney, Agent, or Firm*—Morrison & Foerster LLP

(57) ABSTRACT

Disclosed is an optical semiconductor integrated circuit device has an opening portion in an insulating layer, which is formed in a light receiving region of a photodiode stepwise. Thus, a step of the opening portion is reduced, leading to an improvement of a step coverage of a light shadowing film formed on the insulating film so as to cover the insulating film. By the improvement of the step coverage of the opening portion, the light shadowing film located on a plane of the light shadowing film of the photodiode is not broken. A problem that a conventional light shadowing film is broken is solved in the photodiode for a blue laser beam.

7 Claims, 9 Drawing Sheets

Prior Art

OPTICAL SEMICONDUCTOR INTEGRATED CIRCUIT DEVICE

BACKGROUND OF THE INVENTION

1. Field of the Invention

The present invention relates to an optical semiconductor integrated circuit device incorporating a photodiode for converting a light signal to an electric signal.

2. Description of Related Art

An optical semiconductor device in which a light receiving photodiode is integrated together with its peripheral circuit has been used on a receiving side of light signal transmitting device for transmitting a light signal in the form of an infrared ray as well as in a light signal reading device of an optical pickup apparatus. The integrated circuit device can be expected to realize a cost-down compared to a circuit device fabricated by hybridization discrete parts thereon. The integrated circuit device has a merit that it shows a strong resistance to noises due to external electromagnetic field. In the semiconductor device incorporating the photodiode, regions other than a region where the photodiode is arranged needs to be shadowed from incidence light so that excess photocurrent by the incidence light is not produced to the peripheral circuit.

FIG. 9 shows an example of the semiconductor device incorporating the photodiode (see Japanese Patent Laid-Open No. Hei 10 (1998)-107242).

In FIG. 9, a photodiode 51 and an NPN transistor 52 are shown. The semiconductor device includes a P-type single crystal silicon semiconductor substrate 53, a non-doped first epitaxial layer 54 formed on the substrate 53 by a chemical vapor deposition method, and an N$^-$-type second epitaxial layer 55 formed on the epitaxial layer 54 by the chemical vapor deposition method. A resistivity of the substrate 53 is 2 to 4 Ω·cm. A thickness of the first epitaxial layer 54 is 5 to 10 μm, and a resistivity thereof is 50 Ω·cm or more. A thickness of the second epitaxial layer 55 is 2 to 5 μm, and a resistivity thereof is about 1 Ω·cm.

The substrate 53, the first epitaxial layer 54 and the second epitaxial layer 55 are isolatedly partitioned into a first island region 57 for forming a photodiode 51 and a second island region 58 for forming an NPN transistor 52 by a P-type isolation region 56 reaching from a surface of the epitaxial layer 55 to the substrate 53. The isolation region 56 is composed of a first isolation region 59 diffusing from a surface of the substrate 53 upward and downward, a second isolation region 60 diffusing from a surface of the first epitaxial layer 54 upward and downward, and a third isolation region 61 diffusing from a surface of the second epitaxial layer 55. Each of the first and second island regions 57 and 58 are fully surrounded by a junction boundary between the isolation region 56 and each of the first and second epitaxial layers 54 and 55, and a junction boundary between the substrate 53 and the first epitaxial layer 54.

In the first island region 57, an N$^+$-type diffusion region 62 of the photodiode 51 is formed. The substrate 53 constitutes a positive portion of a PIN (Positive-Intrinsic-Negative) junction. The first and second epitaxial layers 54 and 55 constitute an intrinsic portion of the PIN junction. The N$^+$-type diffusion region 62 is a negative portion of the PIN junction. With this structure, the PIN junction is formed, and the photodiode 51 is formed. The NPN transistor 52 is formed in the second island region 58. The NPN transistor 52 is constituted by an N-type collector region 66, an N-type buried layer 63, a P-type base region 64 and an N-type emitter region 65.

The N-type collector region 66 is formed so as to be connected to the N-type buried layer 63 from a surface of the second epitaxial layer 55. The N-type buried layer 63 is formed so as to straddle a boundary between the first and second epitaxial layers 54 and 55. The P-type base region 64 is formed in a surface of the second epitaxial layer 55. The N-type emitter region 65 is formed in a surface of the base region 64.

The surface of the second epitaxial layer 55 is covered with an oxide film 67, and contact holes are formed by partially perforating the second epitaxial layer 55. The contact holes are formed respectively on the emitter region 65 of the NPN transistor 52, the P-type base region 64 thereof, the collector region 66 thereof, the N$^+$-type diffusion region 62 of the photodiode 51, and the isolation region 56 thereof. A collector electrode 48, a base electrode 49, and an emitter electrode 50 are provided in a region of the NPN transistor 52 through the contact holes. In the N$^+$-type diffusion region 62 of the photodiode 51, a cathode electrode 46 is provided, and in the isolation region 56, an anode electrode 47 is provided.

An, oxide film 68 is formed on the oxide film 67 and the electrodes 46, 47, 48, 49 and 50. On the oxide film 68, an Al layer 45 is formed as a light shading film. The Al layer 45 opens in a portion of the photodiode 51. A thickness of the oxide film on the photodiode 51 is approximately equal to that on the NPN transistor 52. This technology is described for instance in Japanese Patent Laid-Open No. Hei 10 (1998)-107242.

As a recording density is more increased, a wavelength used becomes shorter, and blue laser having a wavelength of 405 nm has been recently focused on.

However, in a photodiode for the blue laser, resin used for a transparent package sealing a chip absorbs energy of incidence light, and the package is burnt. Accordingly, a hollow package for airproofing the chip without using resin needs to be adopted as an IC package. In such a structure, an insulating film on a light receiving region of the photodiode is exposed to air in the hollow package. Then, a reflection of the incidence light occurs in a surface of the insulating film due to difference of a refraction factor between air and the insulating film, and the reflection of the incidence light depends on a thickness of the insulating film. As a result, a problem that a sensitivity of the photodiode is influenced by variations of the thickness of the insulating film has been known. In order to solve this problem, the insulating film on the light receiving region should be removed. On the other hand, it is preferable that the foregoing light shadowing film should cover a portion in the vicinity of the photodiode to prevent entering of unnecessary light. However, a sum of thicknesses of insulating films more increases due to a high integration and a multilayered structure of recent LSIs. When an opening is provided in such an insulating film and a light shadowing film is formed on the insulating film, there is a problem that the light shadowing film is broken by a step of the opening portion.

SUMMARY OF THE INVENTION

The present invention provides an optical semiconductor integrated circuit device that includes a photodiode formed in a semiconductor layer, in which an opening portion is formed stepwise in a portion of an insulating film laminated on a surface of the semiconductor layer, the portion corresponding to a light receiving region of the photodiode, and in which the insulating film is covered with a light shadowing film.

First, by forming the opening portion stepwise, a height of each of steps of the opening portion is reduced. Thus, a step coverage of the light shadowing film covering the opening portion is improved. Accordingly, the light shadowing film is not broken in the step of the opening portion located on an upper plane of the light receiving region of the photodiode. As a result, the problem that the conventional light shadowing film is broken is solved.

Secondly, since the light shadowing film is formed on the inner wall of the opening portion and extends to the vicinity of the photodiode exposed to the opening portion, entering of unnecessary light can be prevented to a maximum extent.

Thirdly, since any one of aluminum, aluminum silicon alloy, and aluminum silicon cupper alloy is used as the light shadowing film, cost spent for forming the light shadowing film can be reduced.

DETAILED DESCRIPTION OF THE PREFERRED EMBODIMENTS

An embodiment of the present invention will be described with reference to the accompanying drawings in detail below.

Figure 1:
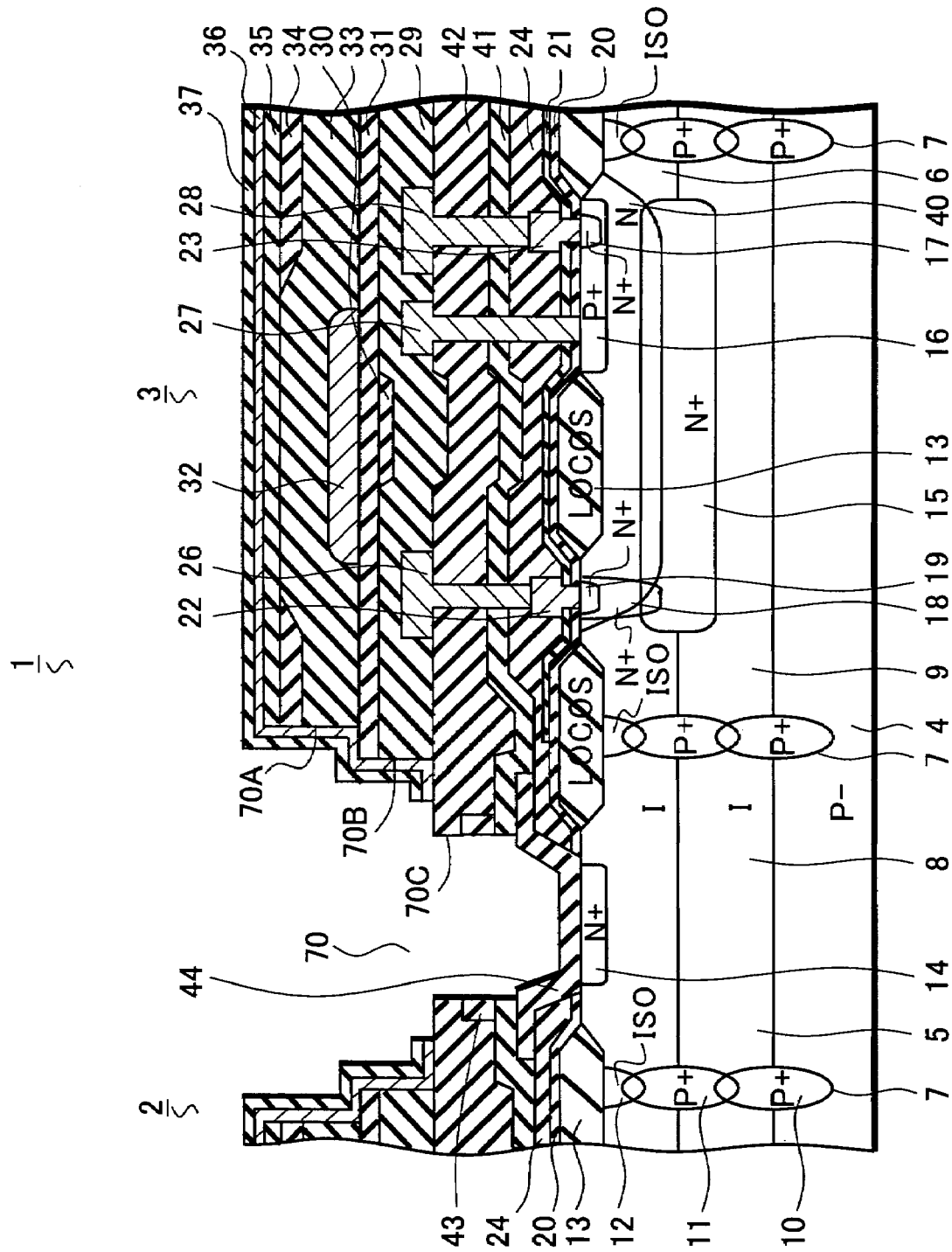
FIG. 1 is a section view for explaining an optical semiconductor integrated circuit device according to an embodiment of the present invention.

FIG. 1 is a section view of an optical semiconductor integrated circuit device incorporating a photodiode 2 and an NPN transistor 3. The optical semiconductor integrated circuit device includes a P-type single crystal silicon semiconductor substrate 4, a non-doped first epitaxial layer 5 formed on the substrate 4 by a chemical vapor deposition method, and a non-doped second epitaxial layer 6 formed on the epitaxial layer 5 by the chemical vapor deposition method. A resistivity of the substrate 4 is 2 to 4 $\Omega \cdot cm$. A thickness of the first epitaxial layer 5 is 5 to 10 $\mu m$, and a resistivity thereof is 50 $\Omega \cdot cm$ or more. A thickness of the second epitaxial layer 6 is about 2 to 5 $\mu m$, and a resistivity thereof is 20 $\Omega \cdot cm$ or more.

The substrate 4, the first epitaxial layer 5 and the second epitaxial layer 6 are isolatedly partitioned into a first island region 8 for forming the photodiode 2 and a second island region 9 for forming an NPN transistor 3 by a P-type isolation area 7, which reaches from a surface of the first and second epitaxial layers 5 and 6 to the substrate 4. The isolation area 7 is composed of first, second and third isolation regions 10, 11 and 12. The first isolation region 10 diffuses a surface of the substrate 4 upward and downward. The second isolation region 11 diffuses from a surface of the first epitaxial layer 5 upward and downward. The third isolation region 12 diffuses from a surface of the second epitaxial layer 6 upward and downward. The first island region 8 is formed so as to be fully surrounded by a junction boundary between the isolation area 7 and each of the first and second epitaxial layers 5 and 6, and by a junction boundary between the substrate 4 and the first epitaxial layer 5. The second island region 9 is formed so as to be fully surrounded by a junction boundary between the isolation area 7 and the first and second epitaxial layers 5 and 6, and by a junction boundary between the substrate 4 and the first epitaxial layer 5. On the P-type isolation area 7, a LOCOS oxide film 13 is formed.

An N-type diffusion region 14 of the photodiode 2 is formed on the first island region 8. The substrate 4 constitutes a Positive portion of a PIN (Positive-Intrinsic-Negative) junction. The first and second epitaxial layers 5 and 6 constitute an Intrinsic portion of the PIN junction. The N-type diffusion region 14 constitutes a Negative portion of the PIN junction. With this structure, the PIN junction is formed, and thus the photodiode 2 is formed. A silicon nitride film 44 is formed on a surface of the N-type diffusion region 14 in order to prevent a reflection of the photodiode 2.

A cathode electrode (not shown) is provided on a portion of the N-type diffusion region 14 where the silicon nitride film 44 is partially removed. An anode electrode (not shown) is provided on a surface of the isolation area 7.

Next, a way how to use the photodiode 2 will be described. The photodiode 2 is allowed to operate in a reverse biased state in which a Vcc potentials such as +5V is applied to the cathode electrode, and a GND potential is applied to the anode electrode. When such a reverse biased state is given to the photodiode 2, a depletion layer spreads into the first and second epitaxial layers 5 and 6 of the photodiode 2. The extremely thick depletion layer can be obtained. Therefore, it is possible to reduce junction capacity of the photodiode 2, thus enabling the photodiode to perform a high speed response.

The NPN transistor 3 is formed in the second island region 9. The NPN transistor 3 is constituted by an N-type intruding region 17, which is an emitter region; a P-type diffusion region 16, which is a base region; an N-type intruding region 19, which is a collector region; an N-type buried layer 15; and N-type diffusion regions 18 and 40.

The N-type diffusion region 18 is formed so as to communicate from a surface of the second expitaxial layer 6 to the N-type buried layer 15. The N-type buried layer 15 is formed so as to straddle a boundary between the first and second epitaxial layers 5 and 6. The P-type diffusion region 16 is formed in the surface of the second epitaxial layer 6. The N-type intruding region 17 is formed in a surface of the P-type diffusion region 16. The LOCOS oxide film 13 is formed between the P-type diffusion region 16 and the N-type diffusion. region 18.

The structure of the inside of the silicon semiconductor layer was described in the above. Thereafter, structures of an electric wiring and an insulating film about the photodiode 2 and about the NPN transistor 3 will be described individually.

First, descriptions of the NPN transistor 3 will be made.

On the surface of the second epitaxial layer 6, a silicon oxide film 20 and a silicon nitride film 21 are deposited in this order. In a region where the NPN transistor 3 is to be formed, portions of the silicon oxide film 20 and the silicon nitride film 21 on the N-type intruding region 17, which is the emitter region, on the P-type diffusion region 16, which is the base region, and on the N-type intruding region 19, which is the collector region, are selectively removed.

In the emitter region and the collector region in the formation region where the NPN transistor 3 is to be formed, polysilicon into which arsenic (As) ions are injected, for example, as N-type impurities is formed. The polysilicon is selectively removed, thus forming a collector extraction electrode 22 and an emitter extraction electrode 23.

A reduced pressure TEOS (Tetra-Ethyl-Orso-Silicate) film 24, a reduced pressure TEOS film 41 and a BPSG (Boron Phospho Silicate Glass) film 42 are deposited so as to cover the collector and emitter extraction electrodes 22 and 23. Contact holes are respectively formed in the reduced pressure TEOS film 24, the reduced TEOS film 41 and the BPSG film 42. The contact holes are formed on the emitter extraction electrode 23 of the NPN transistor 3, the P-type diffusion region 16 thereof, which is the base region, and the collector extraction electrode 22 thereof.

A barrier metal layer and an Al layer are deposited on the BPSG film 42 by a sputtering method in this order. At this time, the barrier metal layer is formed by depositing a titanium (Ti) layer, and a titanium nitride. (TiN) layer in this order. Then, a collector electrode 26, a base electrode 27 and an emitter electrode 28 are formed.

Subsequently, a TEOS film 29 covering the collector electrode 26, the base electrode 27 and the emitter electrode 28 is deposited, and irregularities owing to a first-layered wiring layer is formed in a surface of the TEOS film 29. An SOG film 30 is formed on the surface of the TEOS film 29, and a TEOS film 31 is formed on the SOG film 30. In this embodiment, by forming the SOG film 30 between the TEOS films 29 and 31, the upper surface of the TECOS film 29 where the irregularities are formed by the first-layered wiring layer is flattened. A total thickness of the TEOS film 29, the SOG film 30 and the TEOS film 31 is about 12000 Å. Thereafter, a contact hole (not shown) connecting the first-layered wiring layer and a second-layered wiring layer is opened.

An Al layer is deposited on the TEOS film 31 by a sputtering method, thus forming a second-layered wiring layer 32. A TEOS film 33, an SOG film 34, and a TEOS film 35 are formed on the second-layered wiring layer 32. A total thickness of the TEOS film 33, the SOG film 34 and the TEOS film 35 is about 12000 Å. An Al layer 36 serving as a light shadowing film is deposited on the TEOS film 35, and a silicon nitride film 37 is deposited to a thickness of 8000 to 10000 Å on the Al layer 36.

Descriptions for the NPN transistor 3 was made in the above. Descriptions for the photodiode 2 will be made secondly.

Parts of the silicon oxide film 20 and the reduced pressure TEOS film 24 located on the surface of the N-type diffusion region 14, the deposition of which are simultaneous with that of the formation region of the NPN transistor 3, are removed. The parts of the silicon oxide film 20 and the reduced pressure TEOS film 24, which are removed, surround an external periphery of the N-type diffusion region 14 from the outside of the N-type diffusion region 14 with a distance of about 2 µm. On the surface of the N-type diffusion region 14 from which the silicon oxide film 20 and the reduced pressure TEOS film 24 are removed, the silicon nitride film 44 is formed in order to prevent a reflection of the photodiode 2. The silicon nitride film 44 surrounds an external periphery of a region formed by removing the silicon oxide film 20 and the reduced pressure TEOS film 24. The opening portion 70 is formed on the silicon nitride film 44 by removing part of insulating films on the silicon nitride film 44, the insulating films such as the reduced pressure TEOS film 41, the BPSG film 42, the TEOS film 29 and the SOG film 30 on the silicon nitride film 44, which are deposited simultaneously with the formation region of the NPN transistor 3, are fully removed, whereby an opening portion 70 is formed on the silicon nitride film 44. When the opening portion 70 is formed, an opening portion 70B of the TEOS film 29, the SOG film 30, and the TEOS film 31 is formed so as to be smaller than an opening portion 70A of the TEOS film 33, the SOG film 34, and the TEOS film 35. An opening portion 70C of the reduced pressure TEOS film 41, the BPSG film 42 and a polycrystalline silicon film 43 is formed so as to be further smaller than the opening portion 70B thereof. The opening portion 70A surrounds an external periphery of the opening portion 70B with a distance of 5 to 10 µm. The opening portion 70B surrounds an external periphery of the opening portion 70C with a distance of 10 to 15 µm. As described above, the opening portion 70 is formed stepwise so that an area of a section of the opening portion becomes larger as a distance of the section of the opening portion from the substrate 4 becomes larger. An object to improve a step coverage of a light shadowing film to be deposited later can be achieved. In this embodiment, a stair-like step is formed so as to have three stages. The Al layer 36 is deposited to a thickness of about 1.0 µm on an inner wall of the stair-like opening portion 70 as a light shadowing film. The opening portion 70C is a region for permitting signal light to be incident onto the photodiode 2, and for allowing the photodiode 2 to operate. The BPSG film 42 and the reduced pressure TEOS film 41 have a function as a protection film of the silicon nitride film 44 serving as a reflection prevention film, and the light shadowing film terminates on the protection film, that is, on the BPSG film 42. The light shadowing film covers approximately the, entire of a main portion of the semiconductor chip except for the opening portion 70C so as to cover circuit elements except for the photodiode. Furthermore, an end of the light shadowing film is allowed to extend to so as to be close to an end of the opening portion 70C to a limit of a mask alignment precision. To be concrete, the end of the light shadowing film recedes from an end of the opening portion 70C over the entire circumference by about 3 µm. Next, the silicon nitride film 37 is deposited on the Al layer 36.

Descriptions for the photodiode 2 was made in the above.

The formation of the stair-like opening portion having the above described structure reduces the step of the opening portion. Thus, a step coverage of the light shadowing film covering the opening portion is improved. Accordingly, the light shadowing film is not broken by the step of the opening portion located on an upper plane of the light receiving region of the photodiode. As a result, the problem of the conventional light shadowing film that it is broken is solved with the above described structure of the opening portion in this embodiment.

The above described structure can be obtained by a following manufacturing method.

A method of manufacturing an optical semiconductor integrated circuit device according to an embodiment of the present invention will be described with reference to FIGS. 2 through,8 below in detail.

Figure 2:
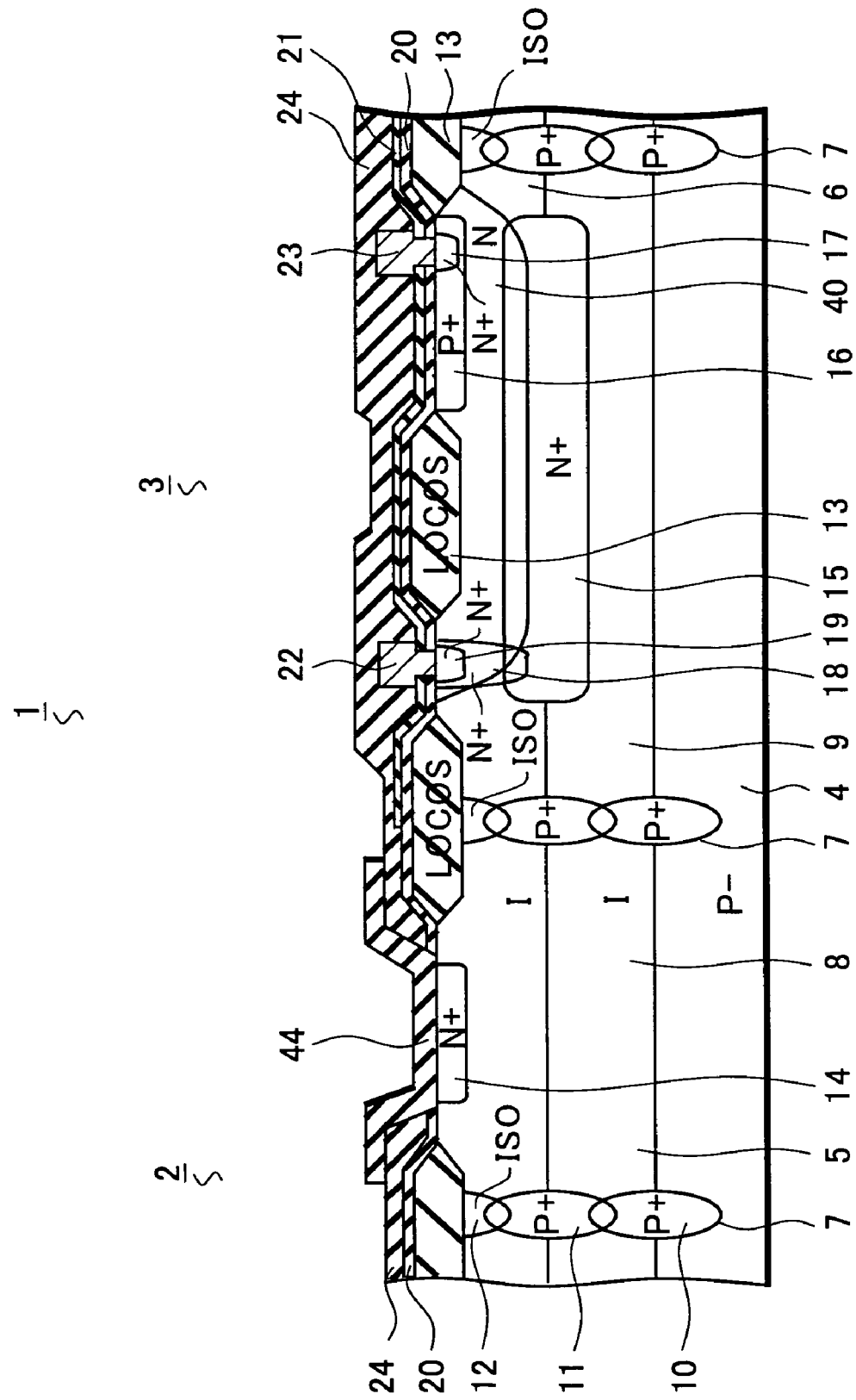
FIG. 2 is a section view for explaining a method of manufacturing the optical semiconductor integrated circuit device according to the embodiment of the present invention.

As shown in FIG. 2, a P-type single crystal silicon substrate 4 having a resistivity of 2 to 4 Ω·cm is first prepared, and boron ions are ion-implanted into an upper surface of the silicon substrate 4 using photoresist as a mask. Subsequently, the implanted boron ions are diffused by performing a thermal process, whereby a first isolation region 10 is formed. Next, a first epitaxial layer 5 is deposited.

Next, a second isolating region 11 and an N-type buried layer 15 of an NPN transistor 3 are sequentially formed for the first epitaxial layer 5. Thereafter, a second epitaxial layer 6 is deposited. For the second epitaxial layer 6, a third isolation region 12, an N-type diffusion region 14 of the photodiode 2, an N-type diffusion region 18, and an N-type diffusion region 40 are sequentially formed. An isolation area 7 is formed by the first, second and third isolation regions 10, 11 and 12.

Next, a LOCOS oxide film 13 having a thickness of about 8000 Å is formed at desired regions of the second epitaxial layer 6. Particularly, by forming the LOCOS oxide film 13 on the isolation area 7, an inter-element isolation can be achieved more perfectly.

Next, a P-type diffusion region 16 is formed for the second epitaxial layer 6.

Subsequently, a silicon oxide film 20 and a silicon nitride 21 are formed on a surface of the second epitaxial layer 6. The silicon oxide film 20 and the silicon nitride film 21 are selectively removed in a formation region where the NPN transistor 3 is to be formed.

Thereafter, in an emitter region and a collector region in the formation region where the NPN transistor 3 is to be formed, polysilicon into which arsenic (As) ions are injected as N-type impurities is formed. The polysilicon is selectively removed, thus forming a collector extraction electrode 22 and an emitter extraction electrode 23.

The N-type impurities injected into the polysilicon are diffused thereinto by various kinds of thermal processes performed after the ion-implantation, and thus N-type intruding regions 17 and 19 are formed. Next, the silicon nitride film 21 in a light receiving region of the photodiode 2 is selectively removed by photoetching. Thereafter, a reduced pressure TEOS (Tetra-Ethyl-Orso-Silicate) film 24 is deposited to a thickness of 700 to 900 Å, and the reduced pressure TEOS film 24 and the silicon oxide film 20, which are located on the light receiving region of the photodiode 2, are selectively removed by photoetching. Subsequently, a silicon nitride film 44 is deposited, and a part of the silicon nitride film 44 except for that located on the light receiving region of the photodiode 2 is selectively removed by photoetching. A thickness of the silicon nitride film 44 is selected to a suitable value in accordance with a wavelength of incidence light, in order to achieve a reflection prevention function.

Figure 3:
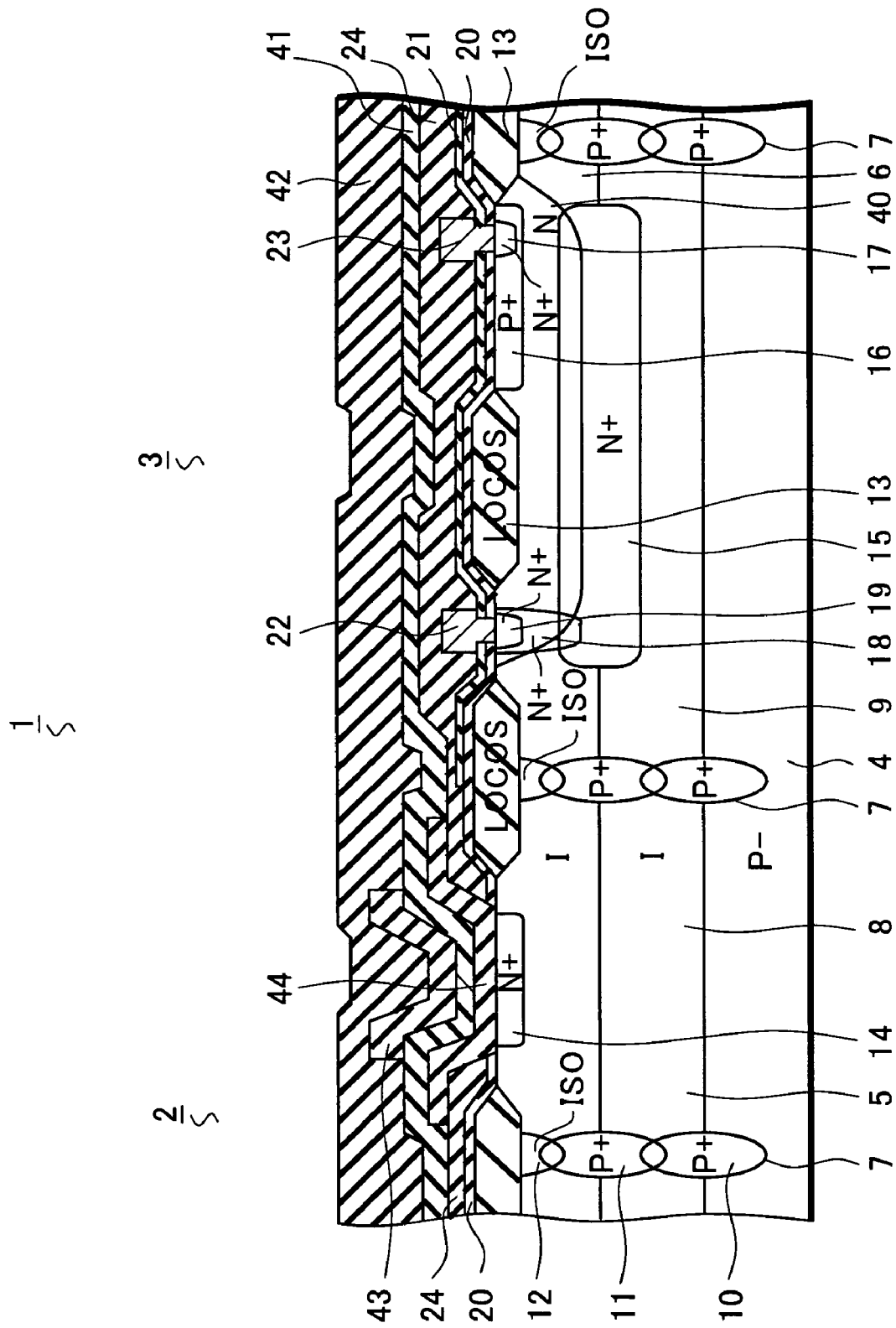
FIG. 3 is a section view for explaining the method of manufacturing the optical semiconductor integrated circuit device according to the embodiment of the present invention.

Next, as shown in FIG. 3, a reduced pressure TEOS film 41 is deposited. Subsequently, a polycrystalline silicon film is deposited to a thickness of 1500 to 2500 Å, and a polycrystalline silicon film 43 is left only on the light receiving region of the photodiode 2 by photoetching the polycrystalline silicon film. Subsequently, a BPSG (Boron Phospho Silicate Glass) film 42 is deposited to a thickness of 8000 to 12000 Å, and a surface of the BPSG film 42 is flown by undergoing a thermal process in the atmosphere of $N_2$ gas. Thus, the surface of the BPSG film 42 is flattened. Thereafter, SOG (Spin On Glass) is coated onto the surface of the BPSG film 42 to a thickness of 1500 to 2500 Å, and then etched-back by dry-etching, thus achieving further flattening.

Figure 4:
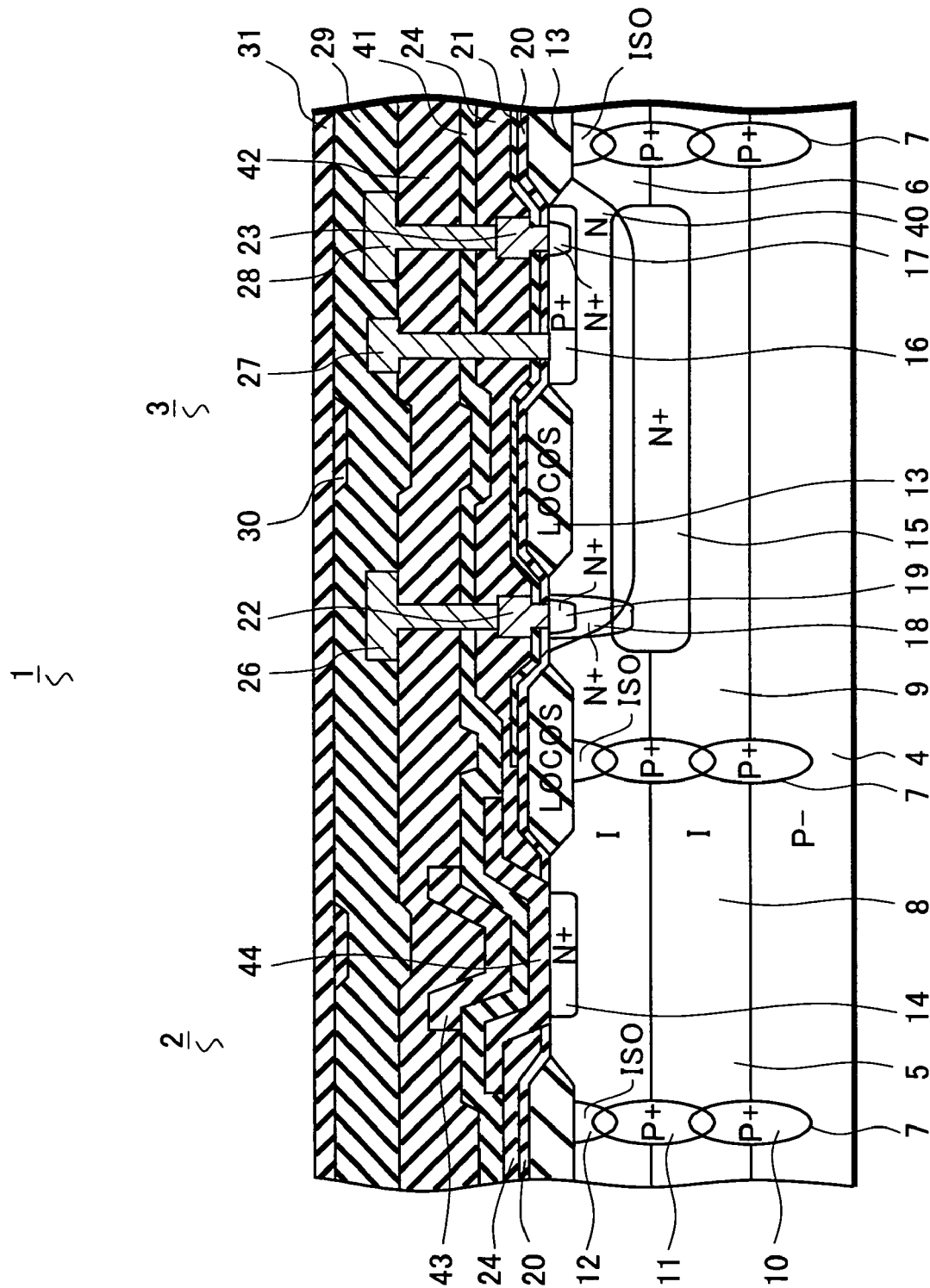
FIG. 4 is a section view for explaining the method of manufacturing the optical semiconductor integrated circuit device according to the embodiment of the present invention.

Next, as shown in FIG. 4, in order to form contact holes in the formation region of the NPN transistor 3, the photoetching is performed. The contact holes are formed on an emitter extraction electrode 23 of the NPN transistor 3, a P-type diffusion region 16, which is a base region of the NPN transistor 3, and a collector extraction electrode. 22 of the NPN transistor 3.

Two contact holes (not shown) in the light receiving region of the photodiode 2 are formed simultaneously with the contact holes in the formation region of the NPN transistor 3. The contact holes in the light receiving region of the photodiode 2 are formed on the N-type diffusion region 14 in order to use one of them for a cathode electrode, and on the isolation region 7 in order to use one of them for an anode electrode.

Thereafter, in the formation region of the NPN transistor 3 and the like, a barrier metal layer and an Al layer are deposited in this order by a sputtering method. At this time, the barrier metal layer is formed by depositing a titanium (Ti) layer and a titanium nitride (TiN) layer in this order. Then, in this embodiment, a collector electrode 26, a base electrode 27, and an emitter electrode 28 are formed in the formation region of the NPN transistor 3. In addition, electrodes (not shown) of the photodiode 2 and other electrode wirings (not shown) are formed simultaneously with the collector electrode 26 and the like.

Figure 5:
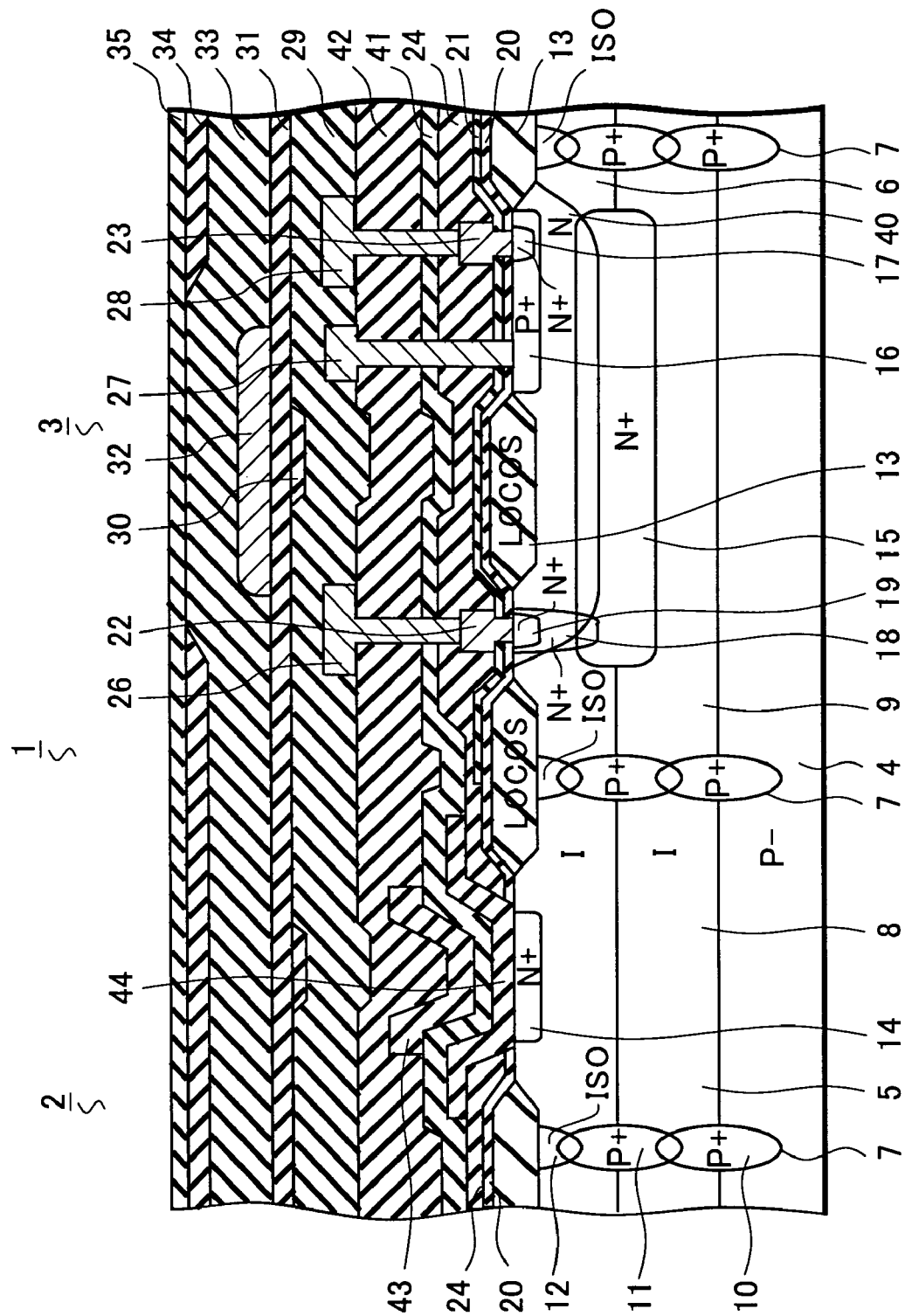
FIG. 5 is a section view for explaining the method of manufacturing the optical semiconductor integrated circuit device according to the embodiment of the present invention.

Next, a TEOS film 29 covering the collector electrode 26, the base electrode 27 and the emitter electrode 28 is deposited. In a surface of the TEOS film 29, irregularities due to a first-layered wiring layer are formed. Thereafter, liquid SOG (Spin On Glass) is coated, and a SOG film 30 is formed. A TEOS film 31 is deposited on the SOG film 30. In this embodiment, by forming the SOG film 30 between the TEOS films 29 and 31, the upper surface of the TEOS film 29 where the irregularities are formed by the first-layered wiring layer is flattened. Then, a contact hole (not shown) connecting the first and second layered wiring layers is opened Next, as shown in FIG. 5, an Al layer is deposited by a sputtering method, and photoetched, whereby a second-layered wiring layer 32 is formed. Thereafter, a TEOS film 33, a SOG film 34 and a TEOS film 35 are formed on an upper surface of the second-layered wiring layer 32 by the same manufacturing method as that the TEOS film 29, the SOG film 30 and the TEOS film 31 were formed.

The above described procedures are formation processes of the wiring layers and the interlayer insulating layers for realizing electrical connections between the integrated circuit elements. After the formation of the wiring layers, an opening portion of an insulating film in the light receiving region of the photodiode is formed, and a light shadowing film is formed, as described in the following.

Figure 6:
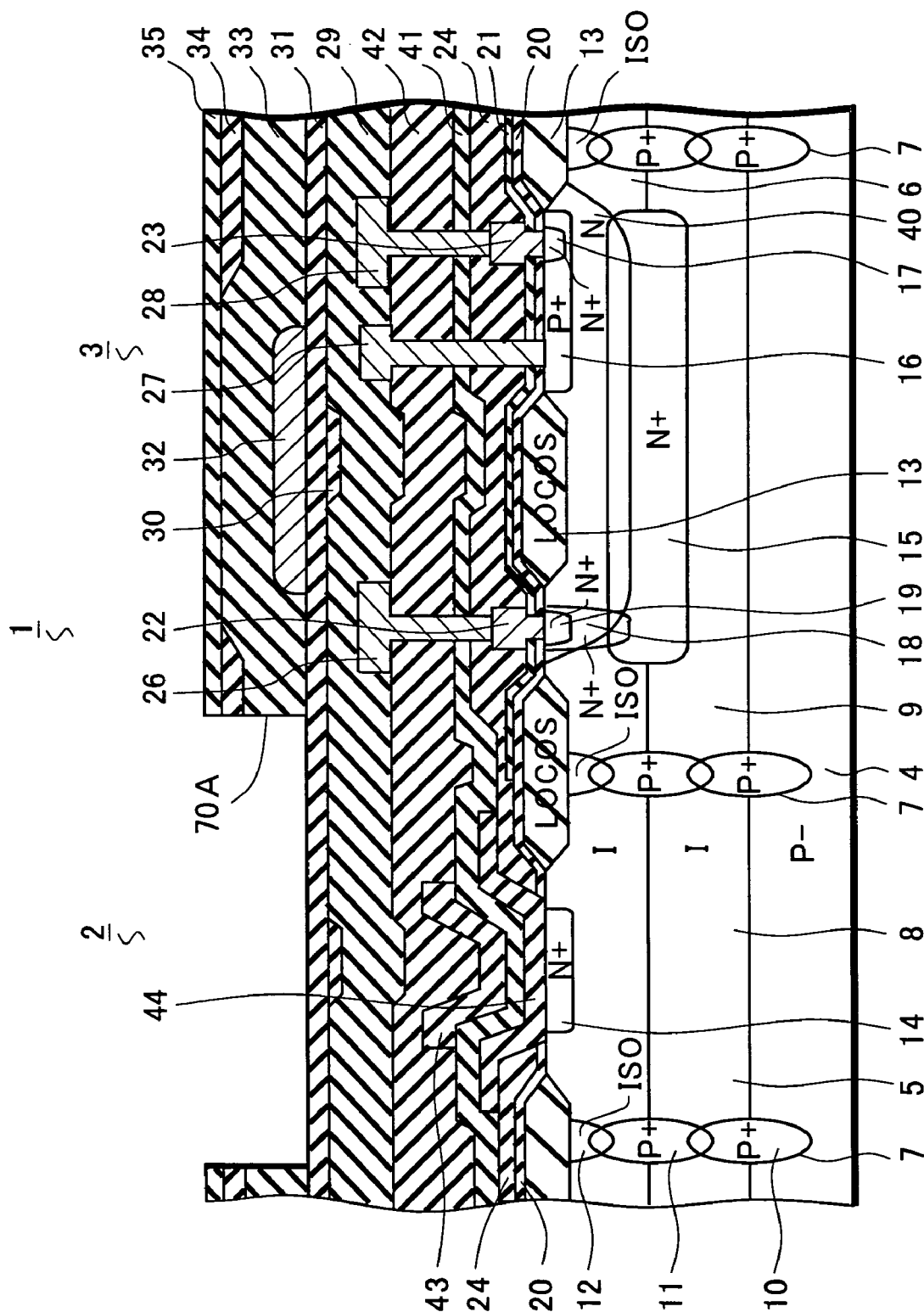
FIG. 6 is a section view for explaining the method of manufacturing the optical semiconductor integrated circuit device according to the embodiment of the present invention.

As shown in FIG. 6, parts of the TEOS film 33, the SOG film 34 and the TEOS film 35 on the light receiving region of the photodiode 2 are etched by photoetching, thus forming an opening portion. Etching is performed to a depth of about 12000 Å by use of $O_2$ and $CHF_3$ gas so that an etching depth reaches to the TEOS film 31. The reason why the etching is stopped at this etching depth is that there is a problem that resist is lost when the etching of the TEOS film 33, the SOG film 34 and the TEOS film 35 is performed to an etching depth more than 12000 Å. Photoetching conditions in this case are as follows. Specifically, the posiresist is formed by a thickness of 2.4 μm, and the etching is performed by use of a reactive ion-etching apparatus with an output power of 1300 W.

Note that the etching depth at the time the opening portion 70A is formed can be varied depending on process conditions of a thickness of the resist film and the like.

Figure 7:
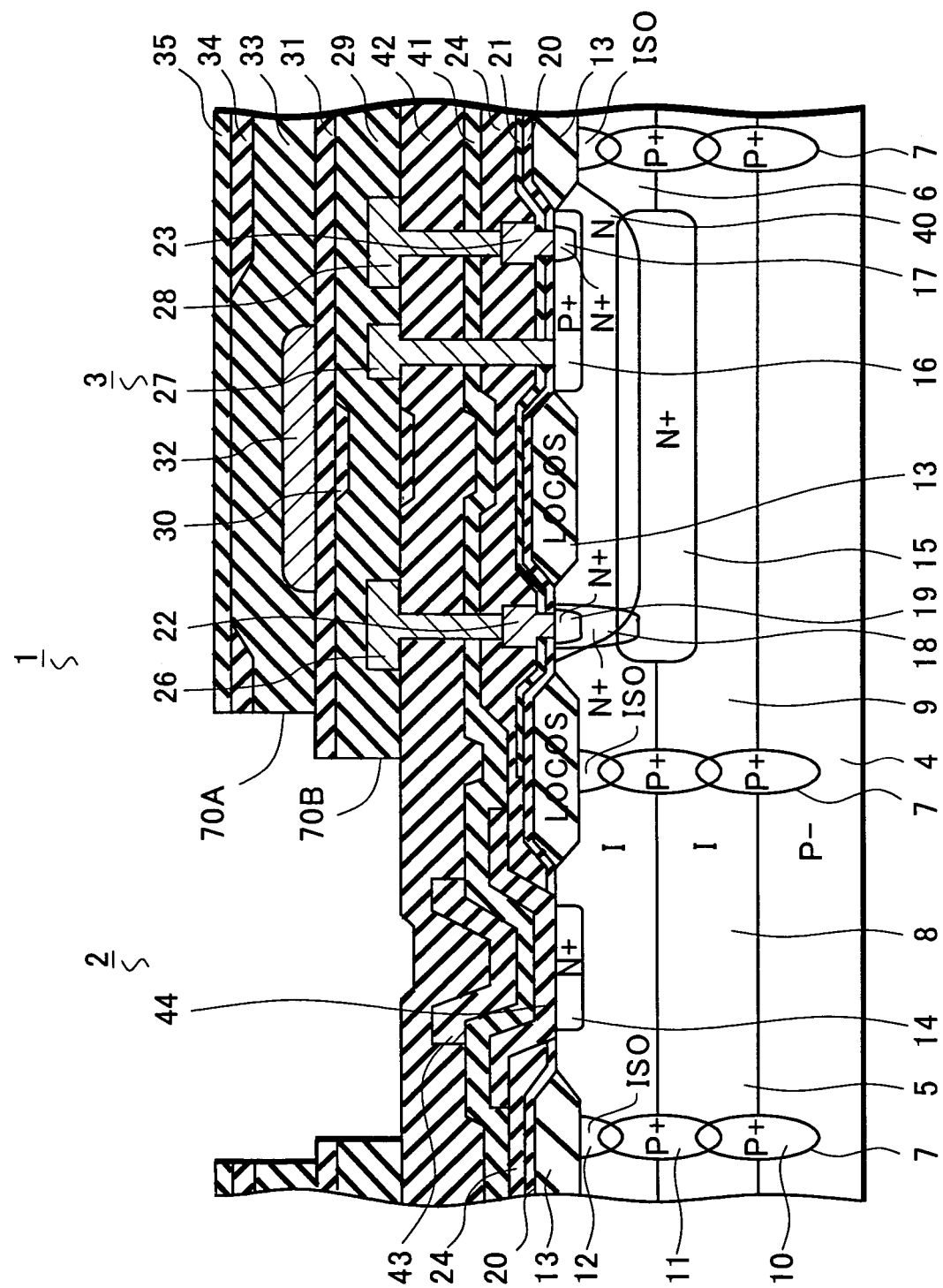
FIG. 7 is a section view for explaining the method of manufacturing the optical semiconductor integrated circuit device according to the embodiment of the present invention.

Next, as shown in FIG. 7, parts of the TEOS film 31, the SOG film 30 and the TEOS film 29 on the receiving region of the photodiode 2 are etched by photoetching, thus forming an opening portion. The etching is performed to a depth reaching the BPSG film 42 by use of $O_2$ and $CHF_3$ gas. At the time of the etching, parts of the TEOS film 33, the SOG film 34 and the TEOS film 35 on the light receiving region of the photodiode 2 are etched so that an opening portion 70 is formed stepwise. Then, an opening portion 70B is smaller than an opening portion 70A, and formed inside the opening portion 70A. By forming the opening portion 70 stepwise so that an area of a section of the opening portion 70 becomes larger as a distance of the section of the opening portion 70 from the substrate 4 becomes larger, a step coverage of the light shadowing film to be deposited later is improved.

Figure 8:
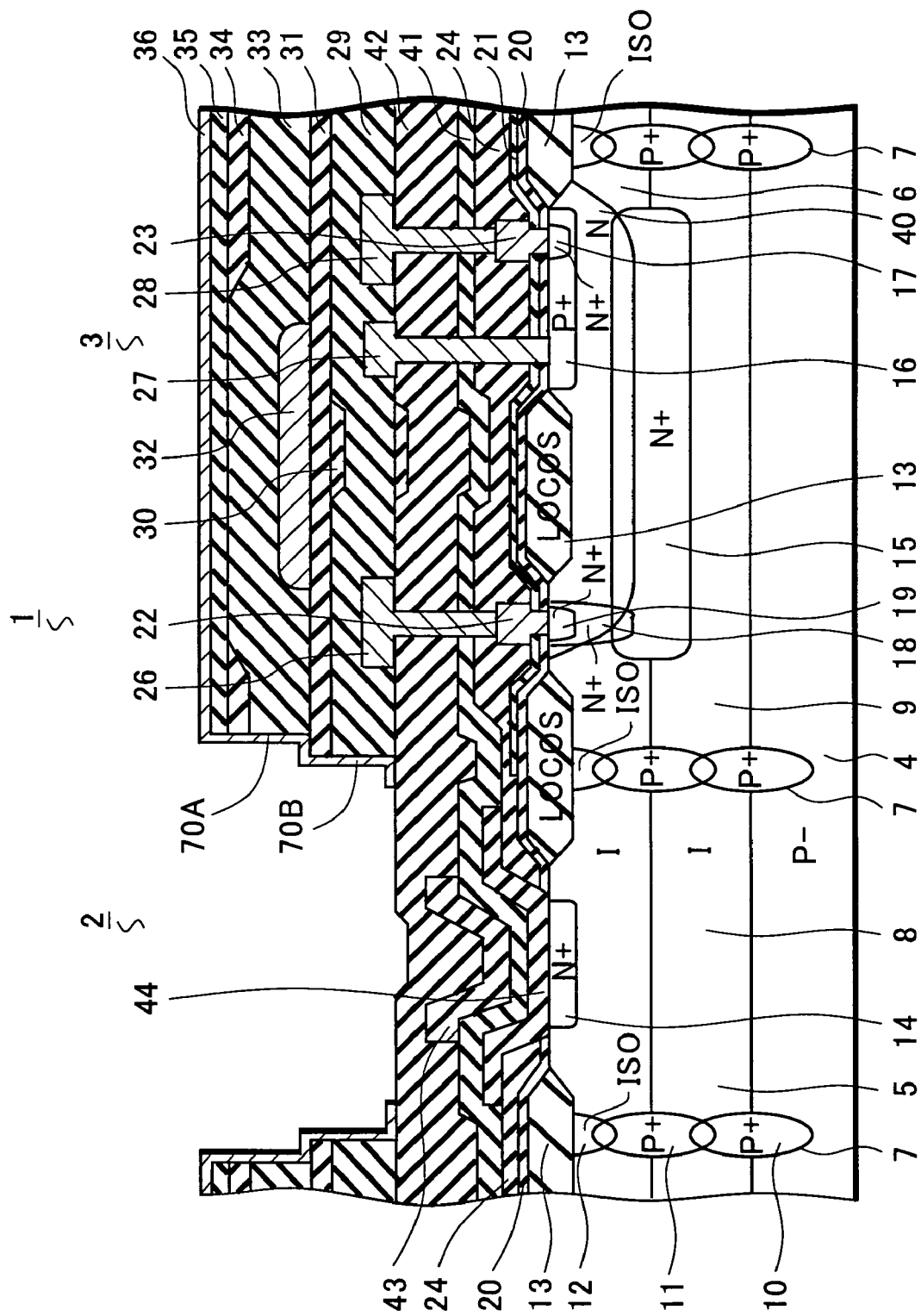
FIG. 8 is a section view for explaining the method of manufacturing the optical semiconductor integrated circuit device according to the embodiment of the present invention.
Figure 9:
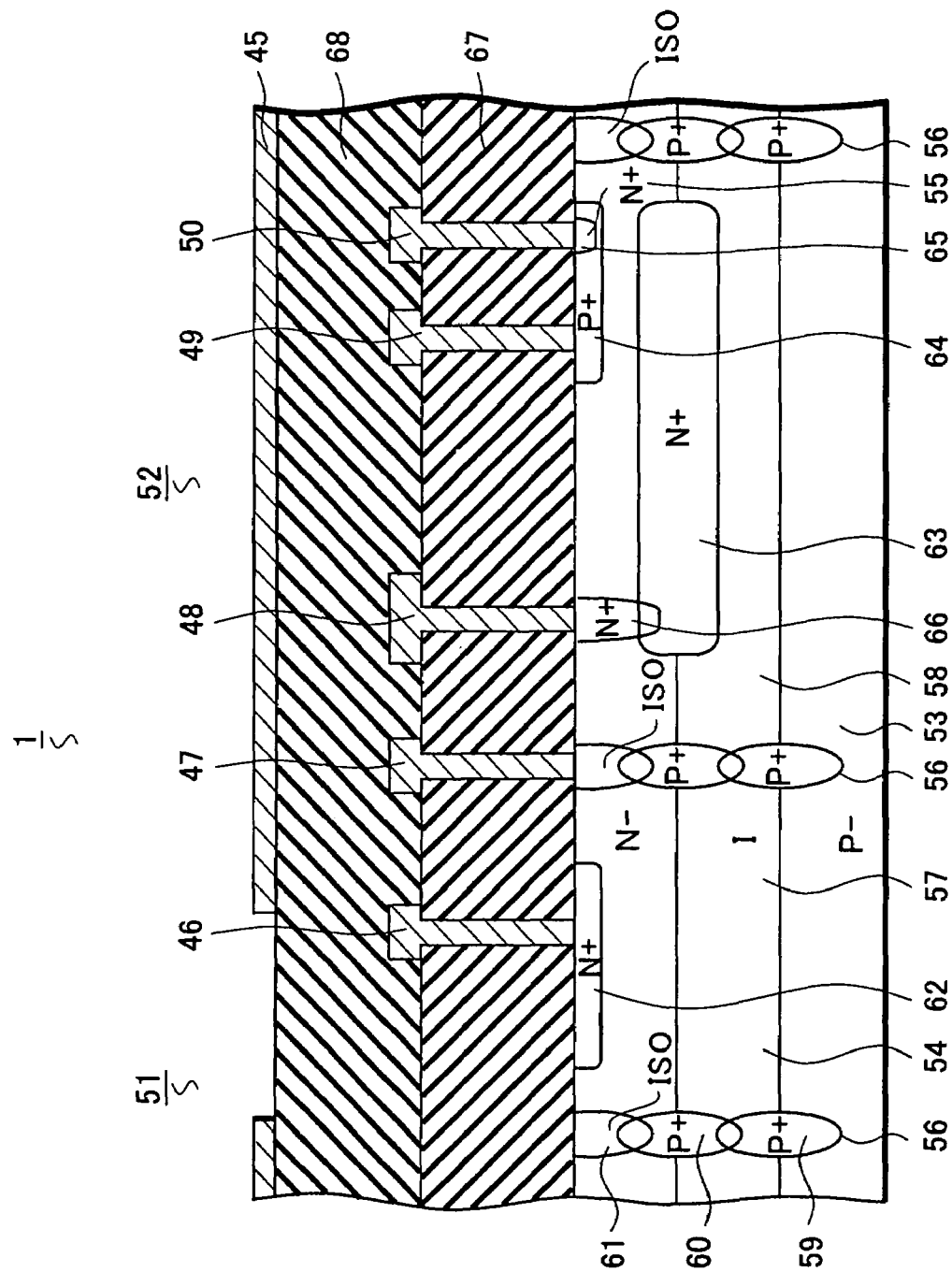
FIG. 9 is a section view for explaining a conventional optical semiconductor integrated circuit device.

Next, as shown in FIG. 8, an Al layer 36 is deposited as the light shadowing film to about 1.0 μm, and the Al layer 36 on the light receiving region of the photodiode 2 is photoetched. At the time of photoetching, an end of the light shadowing film is made close to an end of the opening portion 70C to a limit of a mask alignment precision. To be concrete, the end of the light shadowing film recedes from an end of the opening portion 70C over the entire circumference by about 3 μm.

The etching in this case is dry etching, and $BCl_3$, $Cl_2$ and $CH_2F_2$ are used as etching gas. Although aluminum (Al) is adopted as the light shadowing film in this embodiment, the light shadowing film is not necessarily limited to aluminum (Al), and aluminum silicon alloy or aluminum silicon cupper alloy, for example, may be adopted.

Next, as shown in FIG. 1, a silicon nitride film 37 is deposited to about 6000 Å, and the silicon nitride film 37 on the light receiving region of the photodiode 2 is photoetched. The etching in this case is dryetching, and $O_2$ and $CF_4$ are used as etching gas. Then, the BPSG film 42, the polycrystalline silicon film 43 and the reduce pressure TEOS film 41 on the light receiving region of the photodiode 2 are photoetched, thus forming the opening portion 70. At this time, the TEOS film 31, the SOG film 30 and the TEOS film 29 on the light receiving region of the photodiode 2 are etched so that an area of a section of the opening portion becomes larger as a distance of the section of the opening portion from the substrate 4 becomes larger, thus forming the opening portion 70 stepwise. By forming the opening portion 70 stepwise so that an area of a section of the opening portion 70 becomes larger as a distance of the section of the opening portion 70 from the substrate 4 becomes larger, a step coverage of the light shadowing film is improved. The etching of the BPSG film 42 is dryetching in this case, and $O_2$ and $CHF_3$ are used as etching gas. The etching of the polycrystalline silicon film 43 is dryetching, and $O_2$ and $CF_4$ are used as etching gas. The etching of the reduce pressure TEOS film 41 is wetetching, and HF group etchant is used. The optical semiconductor integrated circuit device 1 is finished by passing through processes by the foregoing manufacturing method. By repeating the plurality of photoetching processes, well-understood photoresist conditions can be realized.

What is claimed is:

1. An optical semiconductor integrated circuit device comprising:
    a semiconductor layer;
    a photodiode formed in the semiconductor layer and comprising a light receiving region;
    a first insulating layer formed on the semiconductor layer and having a first opening portion above the light receiving region, the first opening being a through hole formed in the first insulation layer to penetrate through a thickness of the first insulation layer;
    a second insulating layer formed on the first insulating layer and having a second opening portion above the light receiving region;
    a third insulating layer formed on the second insulating layer and having a third opening portion above the light receiving region; and
    a light blocking film formed on the third insulating layer and entering the third opening portion,
    wherein the second opening portion is larger than the first opening portion, the third opening portion is larger than the second opening portion, and edges of the first, second and third opening portions are aligned stepwise.

2. The optical semiconductor integrated circuit device according to claim 1, wherein the light blocking film is extended to cover the edge of the second opening portion.

3. The optical semiconductor integrated circuit device according to claim 1 or 2, wherein the light blocking film is made of aluminum, an aluminum silicon alloy or an aluminum silicon cupper alloy.

4. The optical semiconductor integrated circuit device according to claim 1, wherein the light blocking film is not in contact with the semiconductor layer.

5. The optical semiconductor integrated circuit device according to claim 1, further comprising an antireflection film in direct contact with the light receiving region.

6. The optical semiconductor integrated circuit device according to claim 5, wherein the antireflection film comprises silicon nitride.

7. The optical semiconductor integrated circuit device according to claim 1, wherein the light blocking film extends to cover a sidewall of the third opening and a sidewall of the second opening and terminates on the first insulating layer so as not to cover a sidewall of the first opening.

* * * * *